US010847631B2

(12) United States Patent
Cappellani et al.

(10) Patent No.: US 10,847,631 B2
(45) Date of Patent: Nov. 24, 2020

(54) GATE-ALL-AROUND (GAA) TRANSISTORS WITH NANOWIRES ON AN ISOLATION PEDESTAL

(71) Applicant: Intel Corporation, Santa Clara, CA (US)

(72) Inventors: Annalisa Cappellani, Portland, OR (US); Abhijit Jayant Pethe, Hillsboro, OR (US); Tahir Ghani, Portland, OR (US); Harry Gomez, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 26 days.

(21) Appl. No.: 16/254,489

(22) Filed: Jan. 22, 2019

(65) Prior Publication Data
US 2019/0157411 A1    May 23, 2019

Related U.S. Application Data

(60) Division of application No. 15/335,281, filed on Oct. 26, 2016, now Pat. No. 10,229,981, which is a
(Continued)

(51) Int. Cl.
*H01L 29/423* (2006.01)
*H01L 29/06* (2006.01)
(Continued)

(52) U.S. Cl.
CPC ........ *H01L 29/42392* (2013.01); *B82Y 10/00* (2013.01); *H01L 21/30604* (2013.01);
(Continued)

(58) Field of Classification Search
CPC ........... H01L 29/0673; H01L 29/78696; H01L 29/42392; H01L 29/66439;
(Continued)

(56) References Cited

U.S. PATENT DOCUMENTS 6,855,606 B2    2/2005    Chen et al.
8,735,869 B2    5/2014    Cappellani
(Continued)

FOREIGN PATENT DOCUMENTS

CA    2479024    10/2003
CN    101399207    4/2011
WO    WO-2011141193    11/2011

OTHER PUBLICATIONS

First Office Action for Chinese Patent Application No. 201380044198.7 dated Oct. 28, 2016, 20 pgs., with English translation.
(Continued)

*Primary Examiner* — Younes Boulghassoul
(74) *Attorney, Agent, or Firm* — Schwabe, Williamson & Wyatt, P.C.

(57) ABSTRACT

Strained gate-all-around semiconductor devices formed on globally or locally isolated substrates are described. For example, a semiconductor device includes a semiconductor substrate. An insulating structure is disposed above the semiconductor substrate. A three-dimensional channel region is disposed above the insulating structure. Source and drain regions are disposed on either side of the three-dimensional channel region and on an epitaxial seed layer. The epitaxial seed layer is composed of a semiconductor material different from the three-dimensional channel region and disposed on the insulating structure. A gate electrode stack surrounds the three-dimensional channel region with a portion disposed on the insulating structure and laterally adjacent to the epitaxial seed layer.

11 Claims, 16 Drawing Sheets

Related U.S. Application Data continuation of application No. 14/266,643, filed on Apr. 30, 2014, now Pat. No. 9,484,272, which is a division of application No. 13/629,135, filed on Sep. 27, 2012, now Pat. No. 8,735,869.

(51) Int. Cl.

| | | |
|---|---|---|
| *H01L 29/775* | (2006.01) | |
| *H01L 29/78* | (2006.01) | |
| *H01L 29/786* | (2006.01) | |
| *H01L 29/417* | (2006.01) | |
| *H01L 21/84* | (2006.01) | |
| *H01L 21/306* | (2006.01) | |
| *H01L 29/66* | (2006.01) | |
| *H01L 29/08* | (2006.01) | |
| *B82Y 10/00* | (2011.01) | |
| *H01L 29/40* | (2006.01) | |

(52) U.S. Cl.
CPC ........ *H01L 21/845* (2013.01); *H01L 29/0649* (2013.01); *H01L 29/0673* (2013.01); *H01L 29/0847* (2013.01); *H01L 29/401* (2013.01); *H01L 29/41725* (2013.01); *H01L 29/42356* (2013.01); *H01L 29/66439* (2013.01); *H01L 29/66545* (2013.01); *H01L 29/775* (2013.01); *H01L 29/785* (2013.01); *H01L 29/7848* (2013.01); *H01L 29/78696* (2013.01)

(58) Field of Classification Search
CPC ..... H01L 21/823431; H01L 21/823821; H01L 21/845; H01L 27/0886; H01L 27/0924; H01L 27/1211; H01L 27/10826; H01L 27/10879; H01L 29/41791; H01L 29/66795–66818; H01L 29/785–7856; H01L 2029/7857–7858; H01L 2924/13067; H01L 29/42384–42392; H01L 29/0649; H01L 29/0653; H01L 21/762; H01L 21/76202; H01L 21/76221; H01L 21/76248; H01L 21/76272; H01L 21/76281; H01L 21/823481; H01L 21/823878; H01L 27/1203

See application file for complete search history.

(56) References Cited

U.S. PATENT DOCUMENTS

| | | | |
|---|---|---|---|
| 9,041,106 B2 | 5/2015 | Cappellani | |
| 2003/0178617 A1 | 9/2003 | Appenzeller et al. | |
| 2005/0077510 A1 | 4/2005 | Shu et al. | |
| 2005/0142766 A1 | 6/2005 | Hareland et al. | |
| 2006/0049429 A1* | 3/2006 | Kim | H01L 29/7854 257/213 |
| 2006/0214156 A1 | 9/2006 | Pan et al. | |
| 2008/0017934 A1 | 1/2008 | Kim et al. | |
| 2008/0020537 A1 | 1/2008 | Kim et al. | |
| 2008/0099849 A1* | 5/2008 | Kim | H01L 29/42392 257/365 |
| 2008/0142785 A1 | 6/2008 | Datta et al. | |
| 2008/0211011 A1 | 9/2008 | Takashima et al. | |
| 2008/0272366 A1 | 11/2008 | Moon et al. | |
| 2009/0061568 A1 | 3/2009 | Bangsaruntip et al. | |
| 2009/0090934 A1 | 4/2009 | Tezuka et al. | |
| 2010/0025658 A1 | 2/2010 | Colli | |
| 2010/0068862 A1 | 3/2010 | Lee et al. | |
| 2010/0164102 A1 | 7/2010 | Rachmady et al. | |
| 2010/0297816 A1 | 11/2010 | Bedell et al. | |
| 2011/0012090 A1 | 1/2011 | Singh et al. | |
| 2011/0108803 A1 | 5/2011 | Deligianni et al. | |
| 2011/0133165 A1 | 6/2011 | Bangsaruntip et al. | |
| 2011/0133166 A1 | 6/2011 | Bangsaruntip et al. | |
| 2011/0272673 A1 | 11/2011 | Bangsaruntip et al. | |
| 2012/0007051 A1* | 1/2012 | Bangsaruntip | H01L 29/775 257/24 |
| 2012/0138886 A1 | 6/2012 | Kuhn et al. | |
| 2013/0277714 A1* | 10/2013 | Le | H01L 29/42392 257/190 |
| 2013/0313513 A1* | 11/2013 | Cappellani | H01L 29/42392 257/9 |
| 2013/0320294 A1* | 12/2013 | Cappellani | H01L 29/0649 257/9 |
| 2013/0320455 A1 | 12/2013 | Cappellani | |
| 2013/0341704 A1* | 12/2013 | Rachmady | H01L 29/775 257/327 |
| 2014/0015056 A1 | 1/2014 | Fu et al. | |
| 2014/0061862 A1 | 3/2014 | Vega et al. | |
| 2014/0209865 A1* | 7/2014 | Pillarisetty | H01L 29/66795 257/29 |
| 2014/0225065 A1* | 8/2014 | Rachmady | H01L 29/7851 257/24 |
| 2014/0332861 A1 | 11/2014 | Cheng | |
| 2015/0255280 A1 | 9/2015 | Cappellani | |

OTHER PUBLICATIONS

Second Office Action for Chinese Patent Application No. 201380044198.7 dated Jul. 7, 2017, 7 pgs., no translation.
Notice of Allowance for Chinese Patent Application No. 201380044198.7 dated Mar. 6, 2018, 4 pgs., with English translation.
Extended European Search Report from European Patent Application No. EP 13 84 0833 dated Apr. 19, 2016, 10 pgs.
Notice of Preliminary Rejection from Korean Patent Application No. 10-2015-7002565 dated Mar. 17, 2016, 5 pgs.
Notice of Final Rejection from Korean Patent Application No. 10-2015-7002565 dated Sep. 6, 2016, 3 pgs.
Notice of Allowance for Korean Patent Application No. 10-2015-7002565 dated Oct. 31, 2016, 2 pgs., no translation.
Office Action for Korean Patent Application No. 10-2017-7002248 dated Jun. 21, 2018, 8 pages.
Notice of Allowance for Korean Patent Application No. 10-2017-7002248 dated Nov. 23, 2018, 5 pgs., no translation.
International Search Report and Written Opinion from PCT/US2013/045217 dated Jul. 11, 2014, 14 pgs.
International Preliminary Report on Patentability from PCT/US2013/045217 dated Apr. 9, 2015, 11 pgs.
Office Action and Search Report from Taiwan Patent Application No. 102132572 dated Feb. 9, 2015, 9 pgs.
Notice of Allowance from Taiwan Patent Application No. 102132572 dated Jun. 17, 2015, 2 pgs, no translation.
Office Action from Taiwan Patent Application No. 104123785 dated May 17, 2016, 7 pgs.
Notice of Allowance for Taiwan Patent Application No. 104123785 dated Oct. 7, 2016, 2 pgs., no translation.
Office Action and Search Report from Taiwan Patent Application No. 105136468 dated May 8, 2017, 7 pgs.
Notice of Allowance for Taiwan Patent Application No. 105136468 dated Sep. 22, 2017, 2 pgs., no translation.

\* cited by examiner

GATE-ALL-AROUND (GAA) TRANSISTORS WITH NANOWIRES ON AN ISOLATION PEDESTAL

CROSS-REFERENCE TO RELATED APPLICATIONS

This application is a divisional of U.S. patent application Ser. No. 15/335,281, filed on Oct. 26, 2016, which is a continuation of U.S. patent application Ser. No. 14/266,643, filed on Apr. 30, 2014, now U.S. Pat. No. 9,484,272, issued on Nov. 1, 2016, which is a divisional of U.S. patent application Ser. No. 13/629,135, filed on Sep. 27, 2012, now U.S. Pat. No. 8,735,869, issued on May 27, 2014, the entire contents of which are hereby incorporated by reference herein.

TECHNICAL FIELD

Embodiments of the invention are in the field of semiconductor devices and, in particular, strained gate-all-around semiconductor devices formed on globally or locally isolated substrates.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In other instances, silicon-on-insulator substrates are preferred because of the improved short-channel behavior of tri-gate transistors.

Silicon-on-insulator substrates, formed either by global isolation or local isolation, may also be used to fabricate gate-all-around devices. Many different techniques have been attempted to fabricate such three-dimensional isolated channel devices. However, significant improvements are still needed in the area of isolation formation for such semiconductor devices.

In another aspect, many different techniques have been attempted to improve the mobility of transistors. However, significant improvements are still needed in the area of electron and/or hole mobility improvement for semiconductor devices.

DESCRIPTION OF THE EMBODIMENTS

Figure 1A:
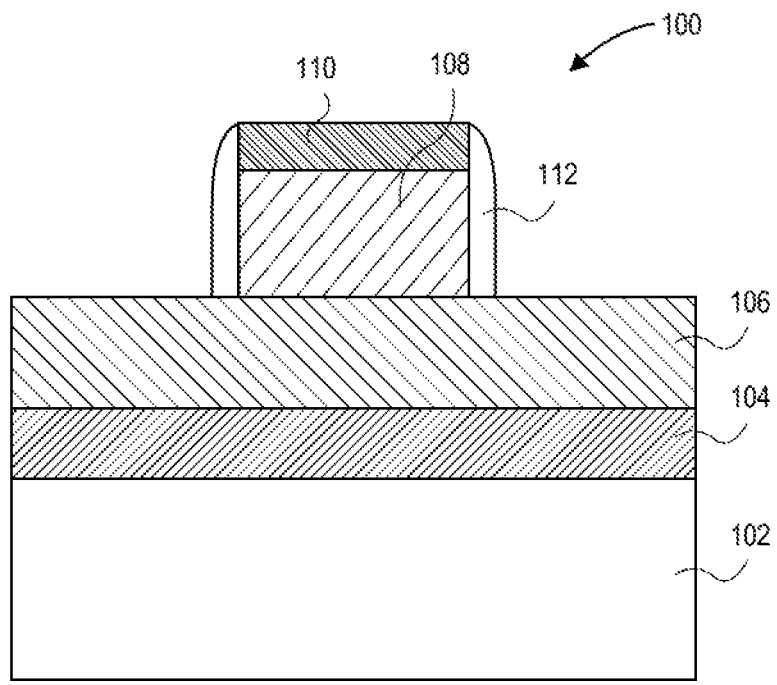
FIGS. 1A and 1B illustrate cross-sectional views of various operations in a method of fabricating a semiconductor device.

Strained gate-all-around semiconductor devices formed on globally or locally isolated substrates are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments of the present invention are directed to the use of or inclusion of an undercut (UC) control layer during semiconductor device fabrication. For example, an undercut control layer may be used to integrate strain in under fin oxidation (UFO) or silicon-on-insulator (SOI) or silicon germanium-on-insulator (SiGeOI) FIN formation to enable, e.g., enhanced channel strain formation. UFO-based structures may be referred to as locally isolated from an underlying substrate, while SOI-based structures may be referred to as globally isolated from an underlying substrate. Embodiments of the present invention may be suitable for both such locally and globally isolated structures. In one or more specific embodiment, an epitaxial seeding layer is retained for epitaxial structure formation. The epitaxial seeding layer may be retained or later removed in subsequent process operations.

In general, solutions described herein may be suitable for straining a partially or entirely isolated device. The isolation may be achieved or may be a result of global isolation (SOI) or local isolation (UFO) where, in either case, an intervening insulating layer is disposed between a channel region an underlying bulk semiconductor substrate. The intervening dielectric layer may be fabricated by, e.g., under fin oxidation (UFO), buried oxide formation (BOX), or replacement dielectrics, or may included in a starting substrate.

Perhaps more specifically, one or more embodiments of the present invention are directed to integrating gate-all-around devices. As such, high performance, low leakage transistor technology approaches are described herein. Difficulty in increasing electron and hole mobility simultaneously when the same channel material is used for both the NMOS and PMOS is also addressed herein. Device performance may be enhanced using strain solutions, higher mobility channel approaches, or higher mobility channel orientations.

Approaches described herein may be used to address issues of carrier mobility in channel materials of semiconductor devices. For example, in an embodiment, an undoped silicon (Si) material channel is provided for a FIN structure. The Si FIN is formed on an $SiO_2$-based substrate to take advantage of a fully undoped channel (e.g., with no subFIN leakage) and minimized gate induced drain leakage (GIDL) or junction leakage. However, Si cannot typically be grown epitaxially on a $SiO_2$ buried layer. Furthermore, if a UFO technique is used to form an oxide layer under the FIN or if an SOI wafer is used, then integration of source or drain (S/D) stressors to transfer the strain to the channel region (such as epitaxial SiGe used to strain a silicon channel region) may be complicated. For example, an undercut process (e.g., removal of starting S/D material) may be inhibited by the restriction of not being able to expose the $SiO_2$ buried layer (or UFO or SiGeOI) since the epitaxially grown stressor may not nucleate and grow on top of the oxide. As such, integrating a maximum available S/D induced strain on an isolated FIN with a buried oxide may be very challenging.

Conventional approaches to integrating epitaxial channel straining regions may include performing a shallow undercut to leave a thin Si layer (or other epitaxial nucleation layer) disposed over a local or global buried oxide in order to enable epitaxial stressor nucleation. Such an approach may not be optimal since any capacity for induced strain will likely be reduced considering the S/D epitaxial volume is limited. Also, with such a controlled undercut technique may not permit integration of epitaxial material to grow in a tip region of a fabricated device which otherwise brings straining features very close to a channel region for maximum the stress transfer.

Figure 1B:
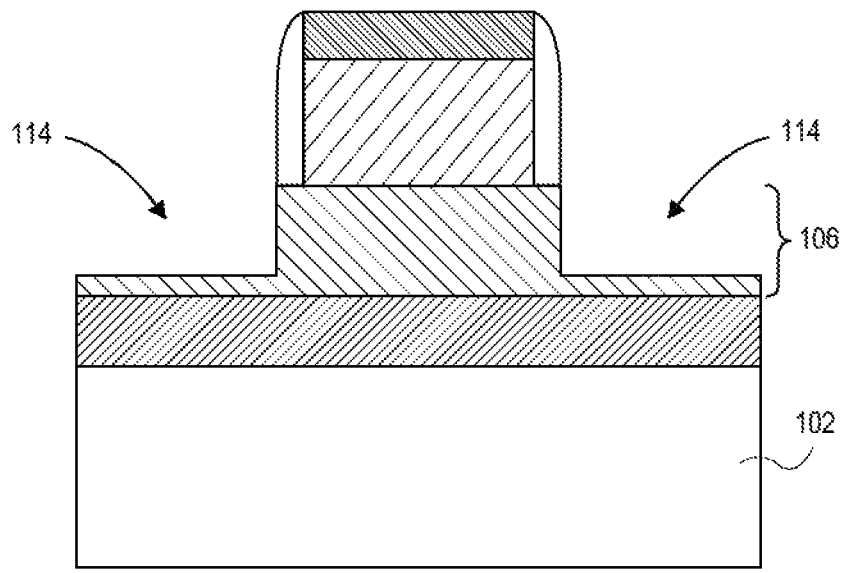

To exemplify the above identified issues with conventional approaches, FIGS. 1A and 1B illustrate cross-sectional views of various operations in a method of fabricating a semiconductor device. Referring to FIG. 1A, a semiconductor structure 100 includes a semiconductor body 106, such as a silicon layer, disposed on an insulating layer 104, such as global or local insulating layer, on a substrate 102, such as a bulk silicon substrate. A gate electrode 108, such as a polysilicon placeholder gate electrode with hardmask 110 and spacers 112, is disposed above the semiconductor body 106. Referring to FIG. 1B, exposed portions of the semiconductor body 106 are recessed to form recessed regions 114. The recessed regions 114 reduce the thickness of the semiconductor body 106, but do not expose the underlying insulating layer 104. The recessed regions 114 provide a location for epitaxial nucleation for, e.g., subsequent source and drain stressor formation. For example, silicon germanium (SiGe) may subsequently be grown on recessed portions 114 of the semiconductor body 106 in order to provide stress to the channel region of the semiconductor body 106 under the gate electrode 108.

However, referring again to FIG. 1B, since a portion of the semiconductor body must be preserved in regions 114 in order to provide a nucleation site (which is not otherwise provided by insulating layer 104) only a shallow recess may be achieved. Additionally, there is little to no undercut of the portion of the semiconductor body 106 under the gate electrode 108 that would otherwise permit formation of epitaxial regions in closer proximity to the active channel region of semiconductor body 106. As such, the shallow recessing and minimal undercut may hinder the extent of allowed epitaxial volume under the gate electrode 108, possibly limiting the amount of stress transferred to the channel region.

As such, one or more embodiments are directed to enabling integration of strain on UFO/SiGeOI FINs by the implementation of an etch stop layer (e.g., where the SiGe is buried) that is sacrificial and may subsequently be removed to provide a gate-all-around or/and contact-all-around structure. The deposition of a sacrificial undercut etch stop layer or sacrificial top layer buffer and its removal in the channel and or S/D regions is described in greater detail below.

Figure 2A:
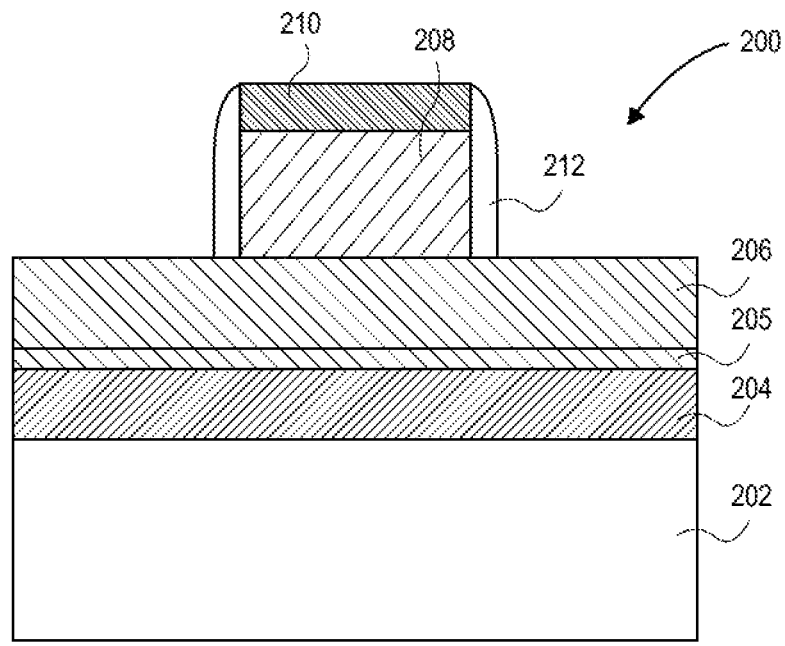
FIGS. 2A-2C illustrate cross-sectional views of various operations in a method of fabricating a semiconductor device, in accordance with an embodiment of the present invention.
Figure 2B:
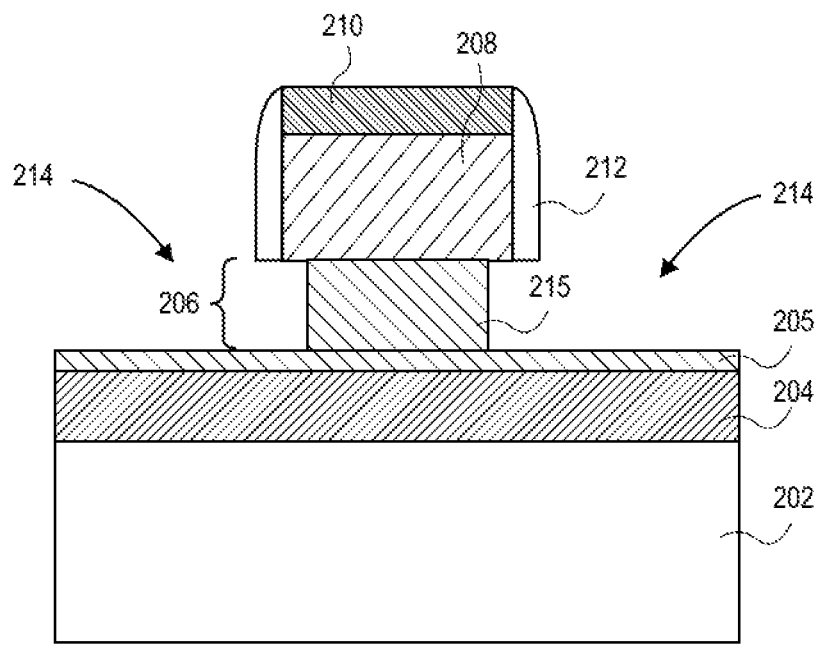
Figure 2C:
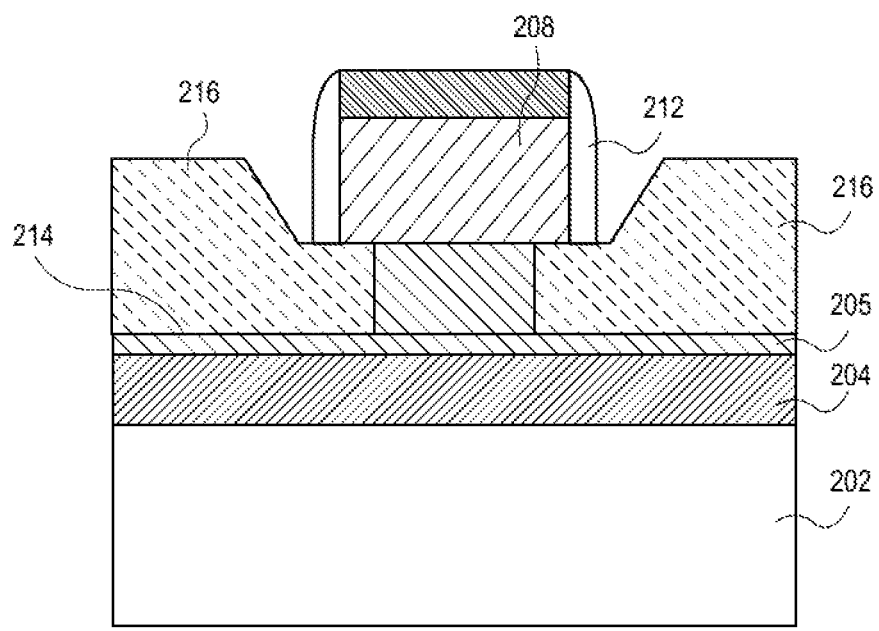

To exemplify the above solutions, FIGS. 2A-2C illustrate cross-sectional views of various operations in a method of fabricating a semiconductor device, in accordance with an embodiment of the present invention. Referring to FIG. 2A, a semiconductor structure 200 includes a semiconductor body 206, such as a silicon layer, disposed on an undercut etch stop layer 205, such as a silicon germanium etch stop layer. The undercut etch stop layer 205 is disposed on insulating layer 204, such as global or local insulating layer, on a substrate 202, such as a bulk silicon substrate. A gate electrode 208, such as a polysilicon placeholder gate electrode with hardmask 210 and spacers 212, is disposed above the semiconductor body 206. Referring to FIG. 2B, exposed portions of the semiconductor body 206 are removed to expose portions 214 of the undercut etch stop layer 205. The portions 214 of the undercut etch stop layer 205 inhibit exposure of the underlying insulating layer 204. Furthermore, an extent 215 of undercut underneath the gate electrode 208 may be achieved since an overetch process may be used to remove portions of the semiconductor body 206.

The portions 214 of the undercut etch stop layer 205 also provide a location for epitaxial nucleation for, e.g., subsequent source and drain stressor formation. For example, epitaxial regions 216 such as silicon germanium (SiGe) epitaxial regions may subsequently be grown on portions 214 of the undercut etch stop layer 205, adjacent to the remaining portion of the semiconductor body 206, as depicted in FIG. 2C. The epitaxial regions 216 may be incorporated to provide stress to the channel region of the semiconductor body 206 under the gate electrode 208.

Although FIGS. 2A-2C illustrate the concepts involved in one or more embodiments of the present invention, more elaborate approaches may also be used to fabricate semiconductor devices that benefit from the use of an undercut etch stop layer. For example, in FIGS. 2A-2C, an intervening insulating layer (e.g., layer 204) has already been formed (as is also the case for the process scheme described in association with FIGS. 6A-6G below) prior to formation of a semiconductor body layer (e.g., layer 206). In other embodiments, such as the case for the process schemes described in association with FIGS. 4A-4J and 5A-5J below, an intervening insulating layer is formed subsequent to semiconductor body formation. Furthermore, in FIGS.

2A-2C, a gate electrode or placeholder electrode is formed prior to recessing of the semiconductor body layer. However, in other embodiments, such as the case for the process schemes described in association with FIGS. 4A-4J, 5A-5J and 6A-6G below, a gate electrode is fabricated following recessing of a semiconductor body layer, enabling formation of gate-all-around semiconductor devices.

Referring again to FIGS. 2A-2C, by using a buried semiconductor layer as an etch stop, then undercut processing may be engineered to maximize volume and under the gate (XUD) control. An optimum available strain may as such be transferable to the corresponding channel region. In one such embodiment, a structure that integrates strained Si FIN on a UFO or SiGeOI substrate is thus achievable. One or more of the process flows described herein, or the resulting structures and devices may be applicable to tri-gate and/or FIN-FET transistors for, e.g., 14 nanometer and smaller process nodes. Embodiments of the invention may involve depositing a Si FIN on a SiGe sacrificial buffer layer and subsequently selectively removing the SiGe buffer layer to ultimately provide a Si FIN gate-all-around or contact-all-around structure.

Figure 3A:
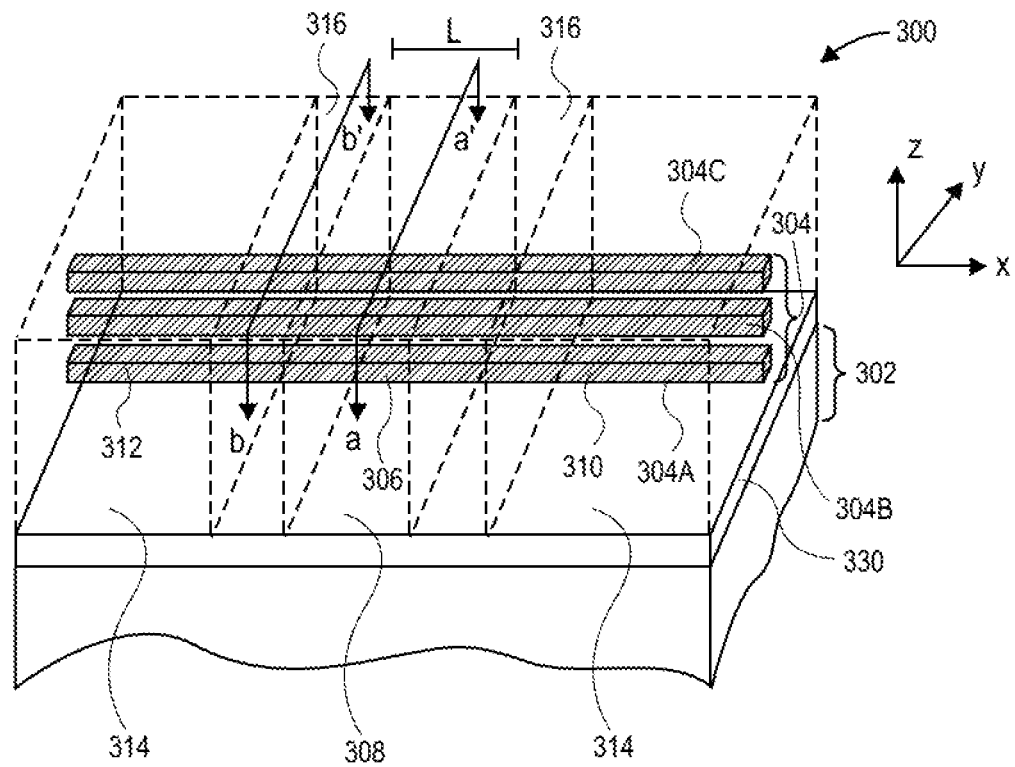
FIG. 3A illustrates a three-dimensional cross-sectional view of a nanowire-based semiconductor structure, in accordance with an embodiment of the present invention.
Figures 3B, 3C:
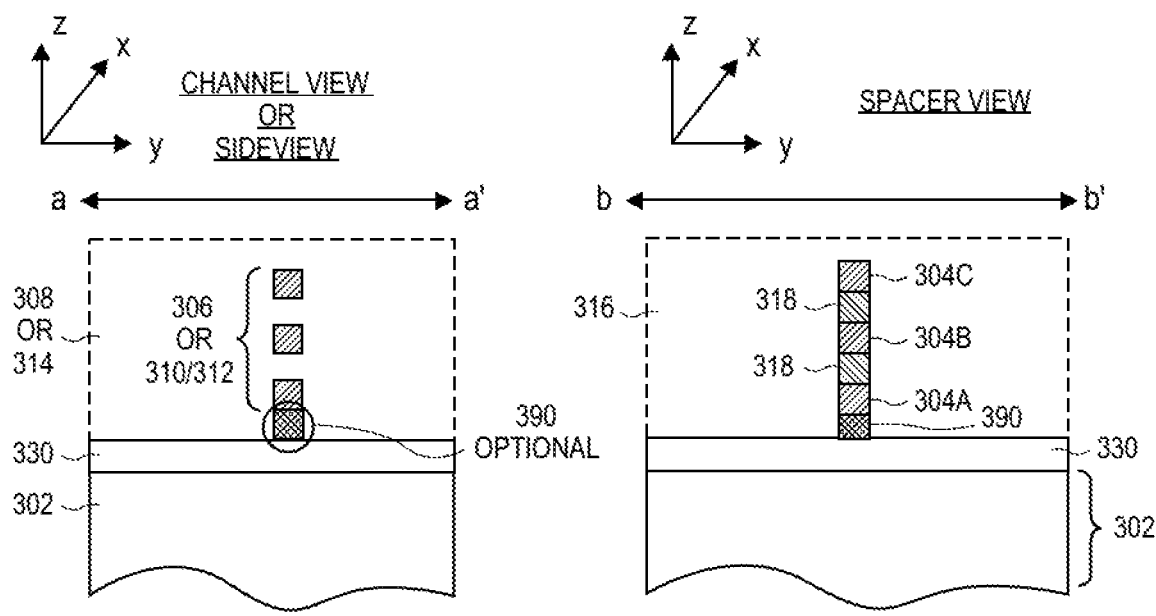
FIG. 3B illustrates a cross-sectional channel view of the nanowire-based semiconductor structure of FIG. 3A, as taken along the a-a' axis, in accordance with an embodiment of the present invention.
FIG. 3C illustrates a cross-sectional spacer view of the nanowire-based semiconductor structure of FIG. 3A, as taken along the b-b' axis, in accordance with an embodiment of the present invention.

In another aspect, the approach described in association with FIGS. 2A-2C may be used in a more complex integration scheme to fabricate nanowire-based devices. For example, FIG. 3A illustrates a three-dimensional cross-sectional view of a nanowire-based semiconductor structure, in accordance with an embodiment of the present invention. FIG. 3B illustrates a cross-sectional channel view of the nanowire-based semiconductor structure of FIG. 3A, as taken along the a-a' axis. FIG. 3C illustrates a cross-sectional spacer view of the nanowire-based semiconductor structure of FIG. 3A, as taken along the b-b' axis.

Referring to FIG. 3A, a semiconductor device 300 includes one or more vertically stacked nanowires (304 set) disposed above a substrate 302. Embodiments herein are targeted at both single wire devices and multiple wire devices. As an example, a three nanowire-based devices having nanowires 304A, 304B and 304C is shown for illustrative purposes. For convenience of description, nanowire 304A is used as an example where description is focused on only one of the nanowires. It is to be understood that where attributes of one nanowire are described, embodiments based on a plurality of nanowires may have the same attributes for each of the nanowires.

Each of the nanowires 304 includes a channel region 306 disposed in the nanowire. The channel region 306 has a length (L). Referring to FIG. 3B, the channel region also has a perimeter orthogonal to the length (L). Referring to both FIGS. 3A and 3B, a gate electrode stack 308 surrounds the entire perimeter of each of the channel regions 306 of nanowires 304C and 304B. In one embodiment, an etch stop semiconductor layer 390 portion (described in greater detail below) is not present under the channel region 306 of nanowire 304A, and the device 300 is thus a gate-all-around device with respect to the first nanowire 304A. In another embodiment, however, the etch stop semiconductor layer 390 portion is present under the channel region 306 of nanowire 304A, and the device 300 is thus not a gate-all-around device with respect to the first nanowire 304A. The gate electrode stack 308 includes a gate electrode along with a gate dielectric layer disposed between the channel region 306 and the gate electrode (not shown).

Referring again to FIG. 3A, each of the nanowires 304 also includes source and drain regions 310 and 312 disposed in the nanowire on either side of the channel region 306. A pair of contacts 314 is disposed over the source/drain regions 310/312. Referring to both FIGS. 3A and 3B, pair of contacts 314 is disposed over the source/drain regions 310/312. In one embodiment, an etch stop semiconductor layer 390 portion (described in greater detail below) is not present under the source or drain region 310 or 312 of nanowire 304A, and the device 300 is thus a contact-all-around device with respect to the first nanowire 304A. In another embodiment, however, the etch stop semiconductor layer 390 portion is present under the source or drain region 310 or 312 of nanowire 304A, and the device 300 is thus not a contact-all-around device with respect to the first nanowire 304A.

Referring again to FIG. 3A, in an embodiment, the semiconductor device 300 further includes a pair of spacers 316. The spacers 316 are disposed between the gate electrode stack 308 and the pair of contacts 314. As described above, the channel regions and the source/drain regions are, in at least several embodiments, made to be discrete. However, not all regions of the nanowires 304 need be, or even can be made to be discrete. For example, referring to FIG. 3C, nanowires 304A-304C are not discrete at the location under spacers 316. In one embodiment, the stack of nanowires 304A-304C have intervening semiconductor material 318 there between, such as silicon germanium intervening between silicon nanowires, or vice versa. In one embodiment, the bottom nanowire 304A is still in contact with an etch stop semiconductor layer 390 portion. Thus, in an embodiment, a portion of the plurality of vertically stacked nanowires under one or both of the spacers is non-discrete.

The etch stop semiconductor layer 390 may be a layer (or remnants thereof) such as the etch stop layer 205 described in association with FIGS. 2A-2C. In one embodiment, the etch stop semiconductor layer 390 is composed of silicon germanium and the overlying nanowire 304A is composed of (or at least is initially composed of) silicon. In another embodiment, the etch stop semiconductor layer 390 is composed of silicon and the overlying nanowire 304A is composed of (or at least is initially composed of) silicon germanium. In an embodiment, portions of the semiconductor layer 390 are removed under the channel region of nanowire 304A and a gate-all-around structure may be formed. In an embodiment, portions of the semiconductor layer 390 are removed under the source and drain regions of nanowire 304A and a contact-all-around structure may be formed. In an embodiment, portions of the semiconductor layer 390 are removed under the channel and the source and drain regions of nanowire 304A and both a gate-all-around structure and a contact-all-around structure may be formed. The etch stop semiconductor layer 390 may be a layer (or remnants thereof) may be used to seed growth of epitaxial regions thereon. For example, the etch stop semiconductor layer 390, at some point, may be used to grow epitaxial straining source and drain regions.

Thus, in accordance with an embodiment of the present invention, the one or more nanowires 304A-304C of the semiconductor device 300 are uniaxially strained nanowires. Thus, a semiconductor device may be fabricated from a single uniaxially strained nanowire (e.g., 304A) or from a plurality of vertically stacked uniaxially strained nanowires (304A-304C), as depicted in FIG. 3A. The uniaxially strained nanowire or plurality of nanowires may be uniaxially strained with tensile strain or with compressive strain. In an embodiment, a compressively uniaxially strained nanowire has a channel region composed of silicon. The corresponding compressively uniaxially straining source and drain regions are composed of silicon germanium ($Si_xGe_y$, where $0<x<100$, and $0<y<100$). In another embodiment, a tensilely uniaxially strained nanowire has a channel region composed of silicon germanium ($Si_xGe_y$, where $0<x<100$, and $0<y<100$). The corresponding tensilely uniaxially straining source and drain regions are composed of silicon. In an embodiment, a PMOS semiconductor device is fabricated from a nanowire having the uniaxial compressive strain. In an embodiment, an NMOS semiconductor device is fabricated from a nanowire having the uniaxial tensile strain.

Referring to FIGS. 3A-3C, the semiconductor device 300 further includes a dielectric layer 330 disposed between a bulk substrate 302 and the nanowires 304A-304C. In an embodiment, the dielectric layer 330 is effectively continuous across a substrate 302 and is a global insulating layer. In one embodiment, the dielectric layer 330 is composed of a dielectric material such as, but not limited to, silicon dioxide, silicon oxy-nitride or silicon nitride. In another embodiment, the nanowires 304A-304C are isolated from a bulk substrate 302 by an isolation pedestal, e.g., they are locally isolated. The isolation pedestal may be composed of a material suitable to electrically isolate at least a portion, if not all, of the nanowire 304A from the bulk substrate 302. For example, in one embodiment, the isolation pedestal is composed of a dielectric material such as, but not limited to, silicon dioxide, silicon oxy-nitride or silicon nitride. In an embodiment, the isolation pedestal is composed of an oxide of the semiconductor material of the bulk substrate 302.

In an embodiment, the term "isolation pedestal" is used to covey a discrete isolation structure formed at a given time, e.g., a discrete structure formed only under a channel region, or a pair of discrete structures formed only under a pair of source and drain regions, or a discrete structure formed under a channel region as well as under a pair of source and drain regions. In another embodiment, the term "isolation pedestal" is used to covey a combination of isolation structures formed at different times, e.g., a discrete structure formed under a channel region in combination with a pair of discrete structures formed, at a different time, under a pair of source and drain regions.

Bulk substrate 302 may be composed of a semiconductor material that can withstand a manufacturing process. In an embodiment, bulk substrate 302 is composed of a crystalline silicon, silicon/germanium or germanium layer doped with a charge carrier, such as but not limited to phosphorus, arsenic, boron or a combination thereof. In one embodiment, the concentration of silicon atoms in bulk substrate 302 is greater than 97%. In another embodiment, bulk substrate 302 is composed of an epitaxial layer grown atop a distinct crystalline substrate, e.g. a silicon epitaxial layer grown atop a boron-doped bulk silicon mono-crystalline substrate. Bulk substrate 302 may alternatively be composed of a group III-V material. In an embodiment, bulk substrate 302 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 302 is composed of a III-V material and the charge-carrier dopant impurity atoms are ones such as, but not limited to, carbon, silicon, germanium, oxygen, sulfur, selenium or tellurium. In another embodiment, bulk substrate 302 is undoped or only lightly doped.

In an embodiment, the gate electrode of gate electrode stack 308 is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the outer few layers of the semiconductor nanowires 304A-304C. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer.

The contacts 314 are, in an embodiment, fabricated from a metal species. The metal species may be a pure metal, such as nickel or cobalt, or may be an alloy such as a metal-metal alloy or a metal-semiconductor alloy (e.g., such as a silicide material). In an embodiment, spacers 316 are composed of an insulative dielectric material such as, but not limited to, silicon dioxide, silicon oxy-nitride or silicon nitride.

Semiconductor device 300 may be any semiconductor device incorporating a gate, one or more channel regions and one or more pairs of source/drain regions. In an embodiment, semiconductor device 300 is one such as, but not limited to, a MOS-FET, a memory transistor, or a Micro-electromechanical System (MEMS). In one embodiment, semiconductor device 300 is a three-dimensional MOS-FET and is a stand-alone device or is one device in a plurality of nested devices. As will be appreciated for a typical integrated circuit, both N- and P-channel transistors may be fabricated on a single substrate to form a CMOS integrated circuit.

Although the device 300 described above is for a single device, e.g., an NMOS or a PMOS device, a CMOS architecture may also be formed to include both NMOS and PMOS channel devices disposed on or above the same substrate. A plurality of such NMOS devices, however, may be fabricated to have different semiconductor body heights and/or may be isolated from or coupled to an underlying bulk substrate. Likewise, a plurality of such PMOS devices may be fabricated to have different semiconductor body heights and/or may be isolated from or coupled to an underlying bulk substrate. Furthermore, additional processing not shown may include processing operations such as back-end interconnect formation and semiconductor die packaging.

A CMOS architecture may also be formed to include both NMOS and PMOS nanowire-based devices disposed on or above the same substrate. Nanowire/nanoribbon structure may be formed by selective etching of sacrificial layers from multilayer epitaxial stacks. The epitaxial layers may be used as a channel or may be selectively removed to form a gap for all-around gate structure. The isolation layer under epitaxial wires may provide electrical isolation and form a bottom gap for all-around gate. The simplest CMOS integration scheme employs N/P MOS channels fabricated with the same material. The process is simpler to fabricate in that it employs a single selective etch. However, as described throughout herein, strain technology may be required to boost device performance. For example, when silicon was used for channel material, PMOS is enhanced by compressive stress and NMOS is enhanced by a tensile stress along channel direction to enhance carrier mobility. In accordance with an embodiment of the present invention, the unique features of a starting material stack are exploited to integrate different NMOS and PMOS channel materials which are optimized for higher mobility. For example, in one embodiment, a sacrificial layer of an NMOS device is used as a PMOS channel and a sacrificial layer of a PMOS device is used as an NMOS channel. Since the sacrificial layer may be removed during processing, independent choice of channel materials and optimization is made possible.

More generally, focusing on a gate-all-around aspect of embodiments of the present invention, different approaches are available to provide a gate surrounding a channel region or a contact surrounding a source/drain region, or both. One or more embodiments of the present invention are directed to a plurality of semiconductor devices having three-dimensional bodies or active regions (e.g., fins) formed from a bulk substrate, such as a bulk single crystalline silicon substrate. One or more of the plurality of devices is subsequently subjected to an under fin oxidation (UFO, described in greater detail below) process to isolate, or at least restrict, the device from the underlying bulk substrate. Accordingly, one or more embodiments include fabrication processes using a selective (versus global) UFO process to provide selective substrate isolation for targeted devices. However, other embodiments are directed to a plurality of semiconductor devices having three-dimensional bodies or active regions formed on a globally insulating substrate.

Figure 4A:
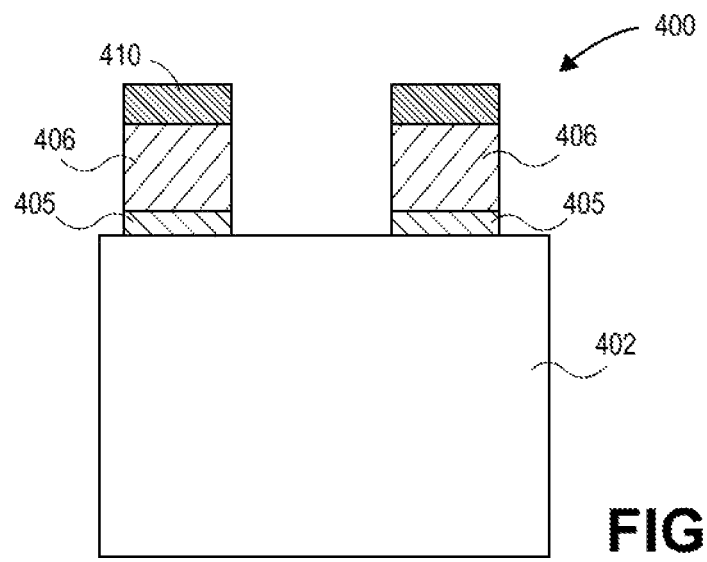
FIGS. 4A-4J illustrate cross-sectional views of various operations in a method of fabricating a semiconductor device, in accordance with an embodiment of the present invention.
Figure 4B:
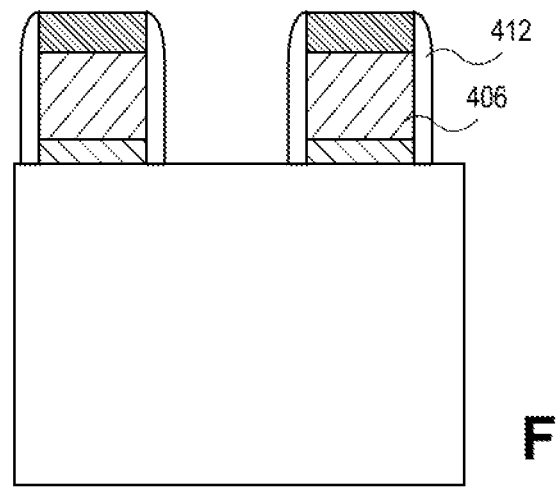
Figure 4C:
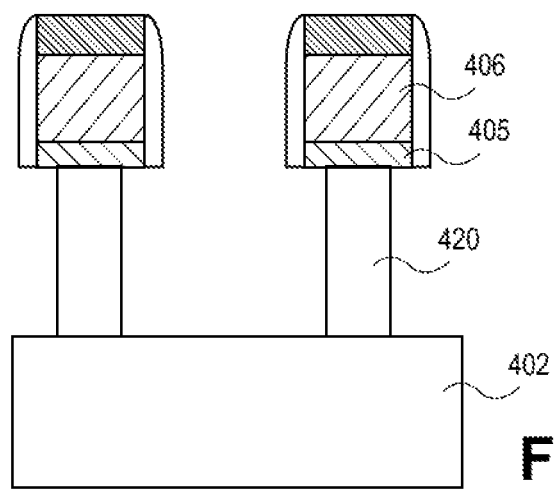
Figure 4D:
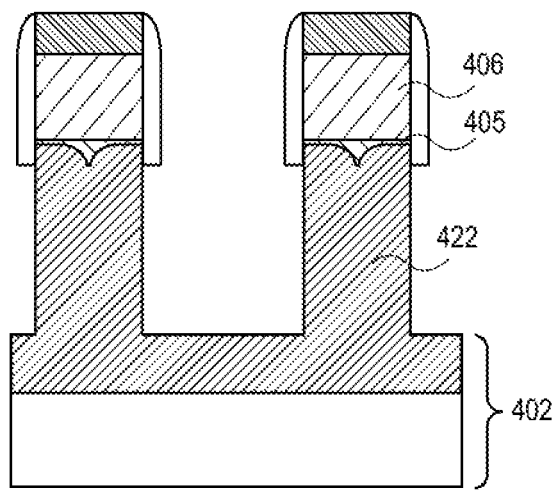
Figure 4E:
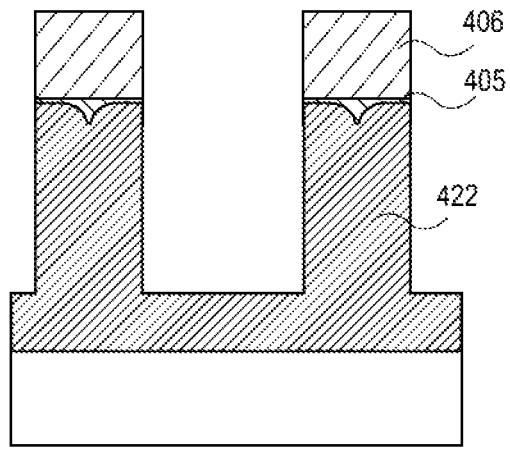
Figure 4F:
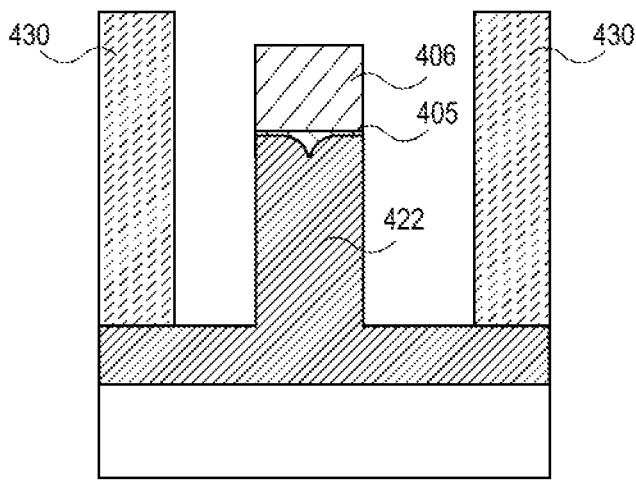
Figure 4G:
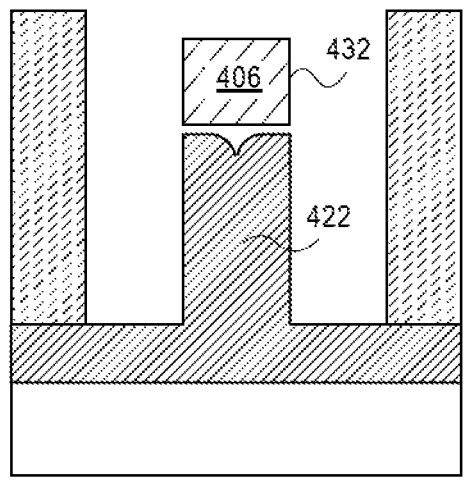
Figure 4H:
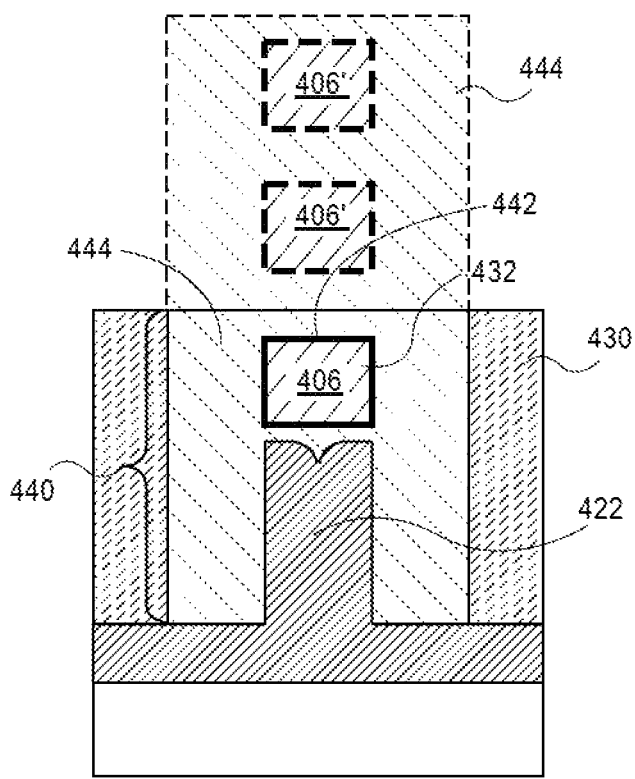
Figure 4I:
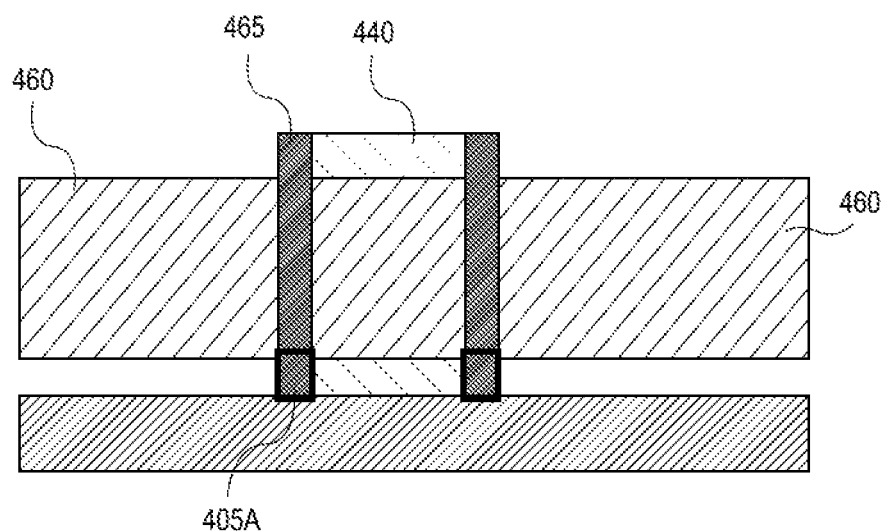
Figure 4J:
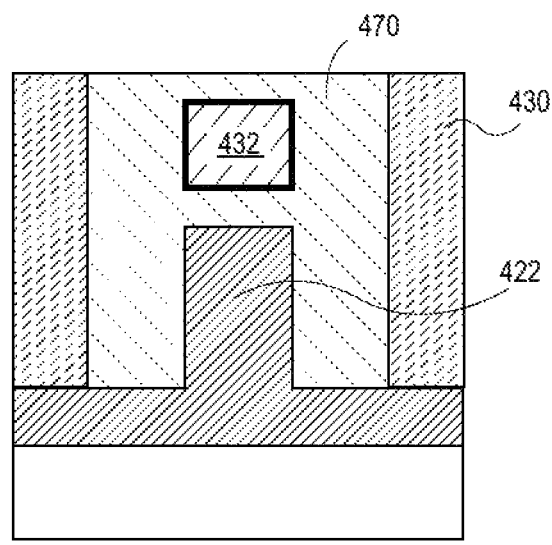

In a first example utilizing a UFO approach, FIGS. 4A-4J illustrate cross-sectional views of various operations in a method of fabricating a semiconductor device, in accordance with an embodiment of the present invention. Referring to FIG. 4A, a starting semiconductor structure 400 includes semiconductor bodies 406, such as silicon fins, disposed on an undercut etch stop layer 405, such as a silicon germanium etch stop layer. The undercut etch stop layer 405 is disposed on a substrate 402, such as a bulk silicon substrate. A hardmask layer 410, such as a silicon nitride hardmask layer, is disposed on the semiconductor bodies 406. Spacers 412, such as silicon nitride spacers are formed along the sidewalls of the semiconductor bodies 406, as depicted in FIG. 4B, e.g., by conformal layer deposition and etch back. Referring to FIG. 4C, exposed portions of the substrate 402 are removed to provide semiconductor pedestals 420 underneath the semiconductor bodies 406. For example, in the case that the semiconductor bodies 406 are protected by silicon nitride hardmask and spacers and by a silicon germanium etch stop layer, the semiconductor pedestals 420 may be formed selectively without impacting the semiconductor bodies 406. The semiconductor pedestals 420 are then oxidized to form isolation pedestals 422, as depicted in FIG. 4D. Oxidation may also occur in the top portion of the remaining substrate 402 and, possibly, somewhat in the etch stop layer 405, as is also depicted in FIG. 4D. However, where a Si Ge layer 405 is used at least a portion remains unoxidized, protecting semiconductor bodies 406 from oxidation. Referring to FIG. 4E, the spacers and hardmask are removed to leave isolation pedestals 422, etch stop layer 405 and semiconductor bodies 406 remaining. Focusing the remainder of the description on only one semiconductor body 406, a dielectric pattern 430 may be formed to surround the semiconductor body 406 and isolation pedestal 422, as depicted in FIG. 4F, e.g., an inter-layer dielectric (ILD) pattern. Referring to FIG. 4G, portions of the etch stop layer 405 are selectively removed to provide an entirely exposed portion 432 of the semiconductor body 406 above isolation pedestal 422. For example, in one embodiment, the portion of the etch stop layer 405 under the channel region of the semiconductor body 406 is removed, e.g., to ultimately enable formation of a gate-all-around structure. In another embodiment, the portions of the etch stop layer 405 under the source/drain regions of the semiconductor body 406 are removed, e.g., to ultimately enable formation of a contact-all-around structure. In another embodiment, at different stages in a process flow, the portion of the etch stop layer 405 under the channel region of the semiconductor body 406 is removed and the portions of the etch stop layer 405 under the source/drain regions of the semiconductor body 406 are removed, e.g., to ultimately enable formation of a gate-all around and a contact-all-around structure. Using the first case as an example, a gate stack 440 is formed within the structure of FIG. 4G to provide a gate-all-around structure 440, as depicted in FIG. 4H. The gate stack 440 includes a gate dielectric layer 442 and a gate electrode 444 material surrounding the channel region 432 of the semiconductor body 406. FIG. 4H also depicts, as dashed lines, an embodiment including additional nanowires 406' stacked above semiconductor body 406, with an additional gate stack portion 444' around the additional nanowires 406'. Referring to FIGS. 4E and 4I (note that FIG. 4I is a view taken perpendicularly from FIG. 4H), before or after the gate formation, epitaxial source and drain regions 460 are formed. In one such embodiment, source and drain regions of the semiconductor body 406 are removed, using corresponding portion of the etch stop layer 405 for selective etching, and epitaxial source and drain regions are formed. Subsequently, as depicted in FIG. 4I, the portions of the etch stop layer 405 under the epitaxial source and drain 460 are removed to enable a contact-all-around structure. Referring to FIG. 4J, in the case that the gate stack 440 is not permanent, the gate stack may be replaced with a permanent gate stack 470, such as a high-k metal gate stack.

It is to be understood that following FIG. 4E above, different combinations of the operations shown in FIGS. 4F-4I may be selected for processing. For example, the source and drain regions of semiconductor body 406 need not be replaced with epitaxial regions. Also, the portions of the etch stop layer under regions 460 need not be removed. Additionally, referring to FIG. 4I as an example, artifacts from processing may remain. As an example, regions 405A of the etch stop layer 405 may remain underneath gate electrode spacers 465. Overall, in a general embodiment however, FIGS. 4A-4J illustrate an exemplary process flow in which a sacrificial SiGe layer is used at the bottom of a fin structure only.

Referring again to FIG. 4D, in an embodiment, the exposed portions of the semiconductor pedestals 420 are oxidized to form the isolation pedestals 422 by "under fin oxidation" (UFO). In an embodiment, the use of spacers may be required if a same or like material is being oxidized, and may even be included if non-like materials are used. In an embodiment, an oxidizing atmosphere or an adjacent oxidizing material may be used for UFO. However, in another embodiment, oxygen implant is used. In some embodiments, a portion of a material is recessed prior to UFO which may reduce the extent of so-called birds-beak formation during oxidation. Thus, the oxidation may be performed directly, by recessing first, or by oxygen implant, or a combination thereof. In another embodiment, in place of UFO, selective removal of a material at the bottom of the fin (e.g., a material that has been previously deposited on the silicon wafer before an additional fin material deposition, such as silicon germanium on a silicon substrate) is performed and replaced with a dielectric material, such as silicon dioxide or silicon nitride. In either the UFO case or the selective material removal case, the location where reoxidation or material replacement is performed can vary. For example, in one such embodiment, the reoxidation or material removal is carried out post gate etch, post spacer etch, at an undercut location, at a replacement gate operation, or at a through contact operation, or a combination thereof.

Referring again to FIG. 4G, in an embodiment, a portion of the silicon germanium etch stop layer 405 is etched selectively with a wet etch that selectively removes the silicon germanium etch stop layer 405 portion while not etching the silicon body 406. Etch chemistries such as carboxylic acid/nitric acid/HF chemistry, and citric acid/nitric acid/HF, for example, may be utilized to selectively etch the silicon germanium. In another embodiment, a silicon etch stop layer is used below a silicon germanium body. Etch chemistries such as aqueous hydroxide chemistries, including ammonium hydroxide and potassium hydroxide, for example, may be utilized to selectively etch the silicon. Thus, either a silicon layer may be removed from a silicon germanium fin-type structure or a silicon germanium layer may be removed from a silicon fin-type structure.

Referring again to FIGS. 4F-4J, gate stack structures may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process comprising $SF_6$. In another embodiment, dummy gates are composed of polycrystalline silicon or amorphous silicon and are removed with a wet etch process comprising aqueous $NH_4OH$ or tetramethylammonium hydroxide. In one embodiment, dummy gates are composed of silicon nitride and are removed with a wet etch including aqueous phosphoric acid.

Figure 5A:
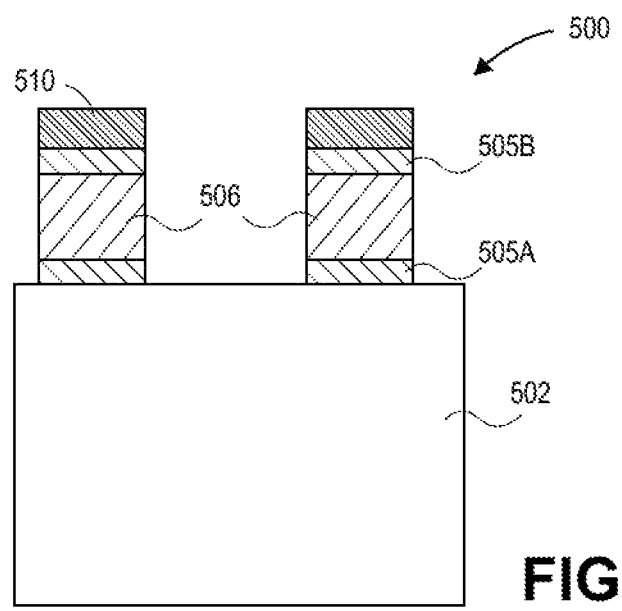
FIGS. 5A-5J illustrate cross-sectional views of various operations in another method of fabricating a semiconductor device, in accordance with an embodiment of the present invention.
Figure 5B:
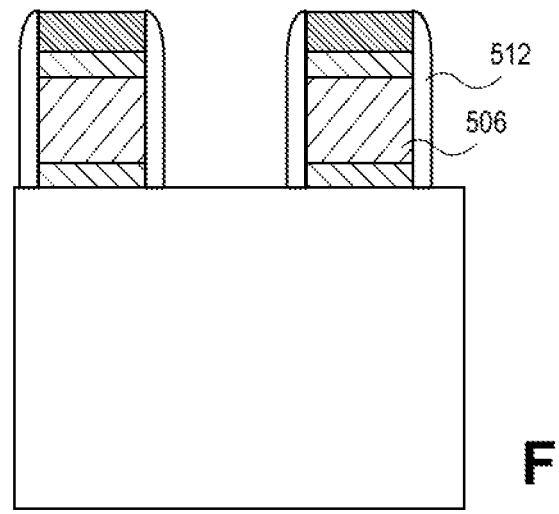
Figure 5C:
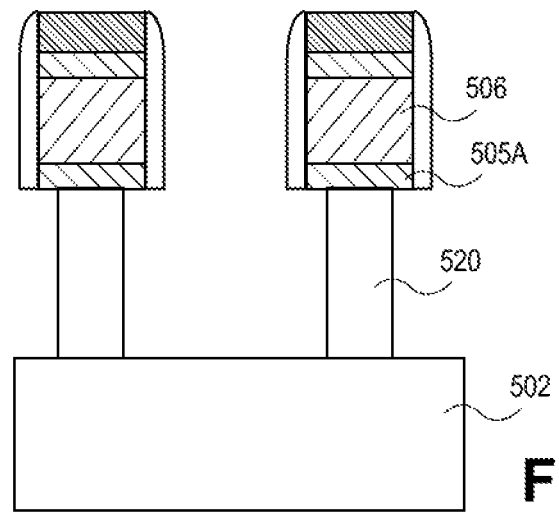
Figure 5D:
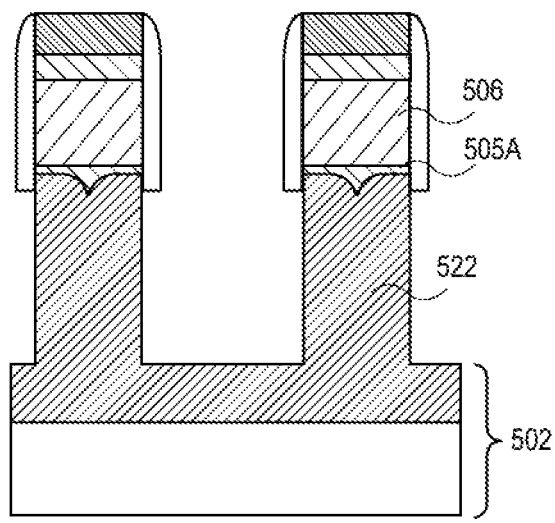
Figure 5E:
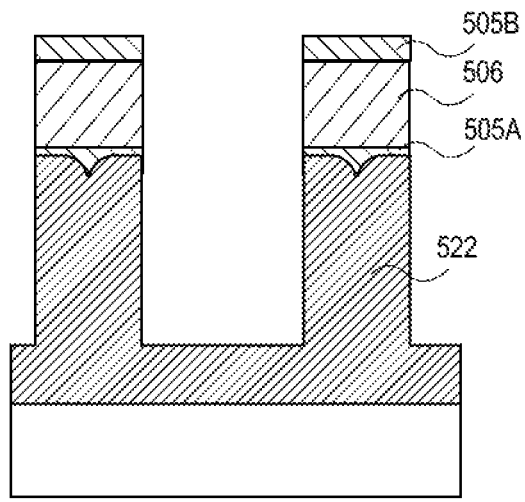
Figure 5F:
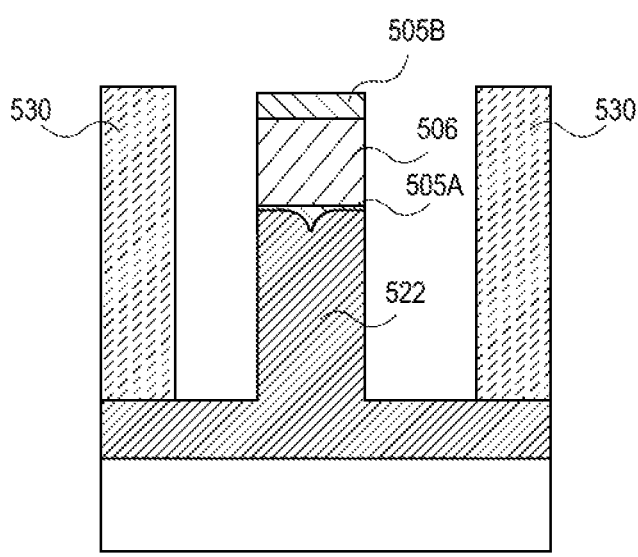
Figure 5G:
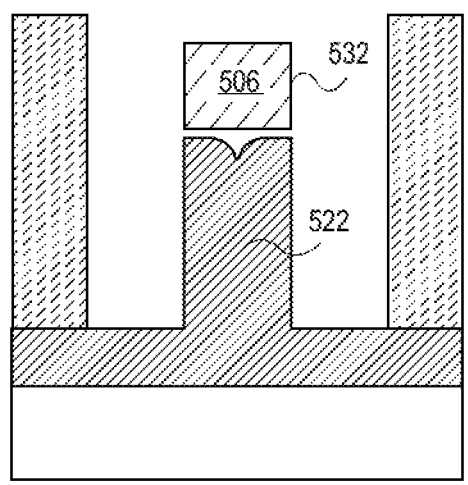
Figure 5H:
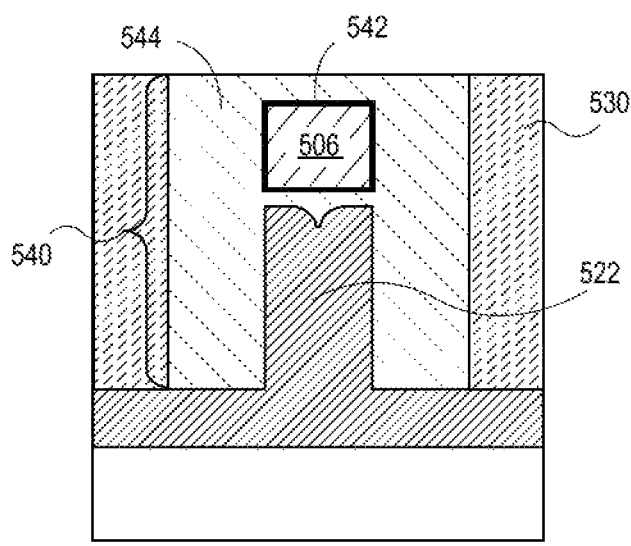
Figure 5I:
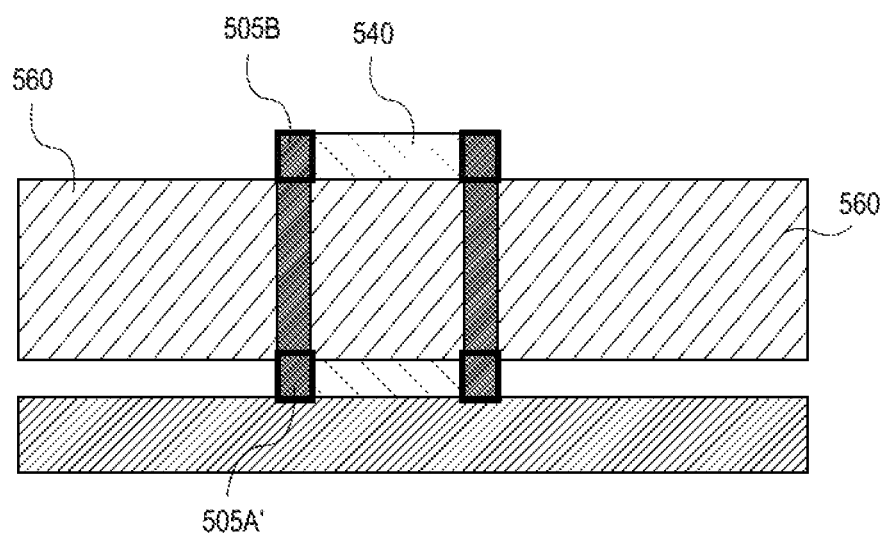
Figure 5J:
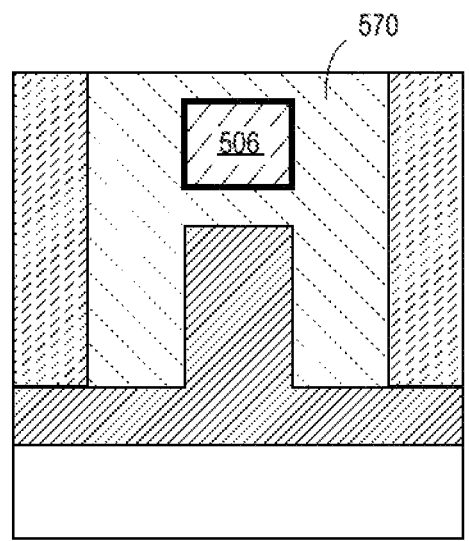

In a second example utilizing a UFO approach, FIGS. 5A-5J illustrate cross-sectional views of various operations in another method of fabricating a semiconductor device, in accordance with an embodiment of the present invention. Referring to FIG. 5A, a starting semiconductor structure 500 includes semiconductor bodies 506, such as silicon fins, disposed on an undercut etch stop layer 505A, such as a silicon germanium etch stop layer. The undercut etch stop layer 505A is disposed on a substrate 502, such as a bulk silicon substrate. A second etch stop layer 505B, such as a second silicon germanium etch stop layer, is disposed on the semiconductor bodies 506. A hardmask layer 510, such as a silicon nitride hardmask layer, is disposed on the second etch stop layer 505B. Spacers 512, such as silicon nitride spacers are formed along the sidewalls of the semiconductor bodies 506, as depicted in FIG. 5B, e.g., by conformal layer deposition and etch back. Referring to FIG. 5C, exposed portions of the substrate 502 are removed to provide semiconductor pedestals 520 underneath the semiconductor bodies 506. For example, in the case that the semiconductor bodies 506 are protected by silicon nitride hardmask and spacers and by a silicon germanium etch stop layer 505A, the semiconductor pedestals 520 may be formed selectively without impacting the semiconductor bodies 506. The semiconductor pedestals 520 are then oxidized to form isolation pedestals 522, as depicted in FIG. 5D. Oxidation may also occur in the top portion of the remaining substrate 502 and, possibly, somewhat in the etch stop layer 505A, as is also depicted in FIG. 5D. However, where a SiGe layer 505A is used at least a portion remains unoxidized, protecting semiconductor bodies 506 from oxidation. Referring to FIG. 5E, the spacers and hardmask are removed to leave isolation pedestals 522, etch stop layers 505A and 505B and semiconductor bodies 506 remaining. Focusing the remainder of the description on only one semiconductor body 506, a dielectric pattern 530 may be formed to surround the semiconductor body 506 and isolation pedestal 522, as depicted in FIG. 5F, e.g., an inter-layer dielectric (ILD) pattern. Referring to FIG. 5G, portions of the etch stop layers 505A and 505B are selectively removed to provide an entirely exposed portion 532 of the semiconductor body 506 above isolation pedestal 522. For example, in one embodiment, the portions of the etch stop layers 505A and 505B under and above the channel region of the semiconductor body 506 are removed, e.g., to ultimately enable formation of a gate-all-around structure. In another embodiment, the portions of the etch stop layers 505A and 505B under and above the source/drain regions of the semiconductor body 506 are removed, e.g., to ultimately enable formation of a contact-all-around structure. In another embodiment, at different stages in a process flow, the portion of the etch stop layers 505A and 505B under and above the channel region of the semiconductor body 506 are removed and the portions of the etch stop layers 505A and 505B under and above the source/drain regions of the semiconductor body 506 are removed, e.g., to ultimately enable formation of a gate-all-around and a contact-all-around structure. Using the first case as an example, a gate stack 540 is formed within the structure of FIG. 5G to provide a gate-all-around structure 550, as depicted in FIG. 5H. The gate stack 540 includes a gate dielectric layer 542 and a gate electrode 544 material surrounding the channel region 532 of the semiconductor body 506. Referring to FIGS. 5E and 5I (note that Figure SI is a view taken perpendicularly from FIG. 5H), before or after the gate formation, epitaxial source and drain regions 560 are formed. In one such embodiment, source and drain regions of the semiconductor body 506 are removed, using corresponding portion of the etch stop layer 505A for selective etching, and epitaxial source and drain regions are formed. Subsequently, as depicted in FIG. 5I, the portions of the etch stop layer 505A under the epitaxial source and drain 560 are removed to enable a contact-all-around structure. Referring to FIG. 5J, in the case that the gate stack 540 is not permanent, the gate stack may be replaced with a permanent gate stack 570, such as a high-k metal gate stack.

It is to be understood that following FIG. 5E above, different combinations of the operations shown in FIGS. 5F-5I may be selected for processing. For example, the source and drain regions of semiconductor body 506 need not be replaced with epitaxial regions. Also, the portions of the etch stop layer under regions 560 need not be removed. Additionally, referring to FIG. 5I as an example, artifacts from processing may remain. As an example, regions 505A' and 505B' of the etch stop layers 505A and 505B, respectively, may remain underneath gate electrode spacers 565. Overall, in a general embodiment however, FIGS. 5A-5J illustrate an exemplary process flow in which a sacrificial SiGe layer is used at the bottom and the top of a fin structure.

Figure 6A:
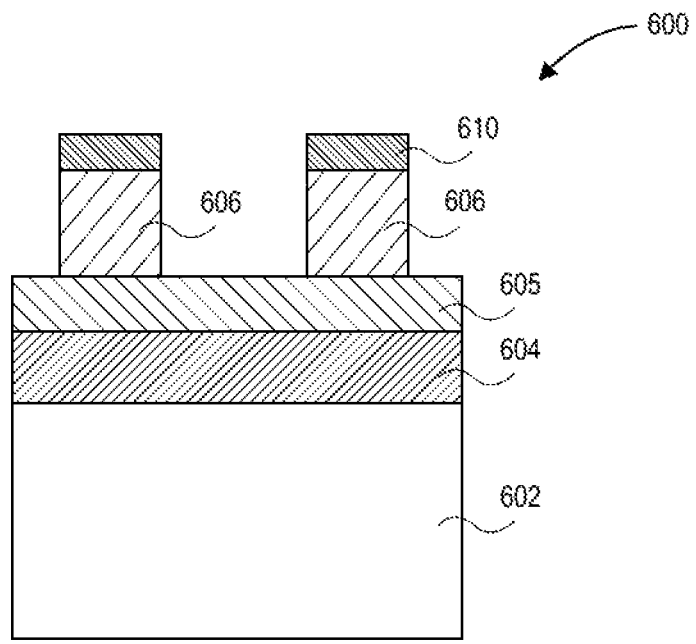
FIGS. 6A-6G illustrate cross-sectional views of various operations in another method of fabricating a semiconductor device, in accordance with an embodiment of the present invention.
Figure 6B:
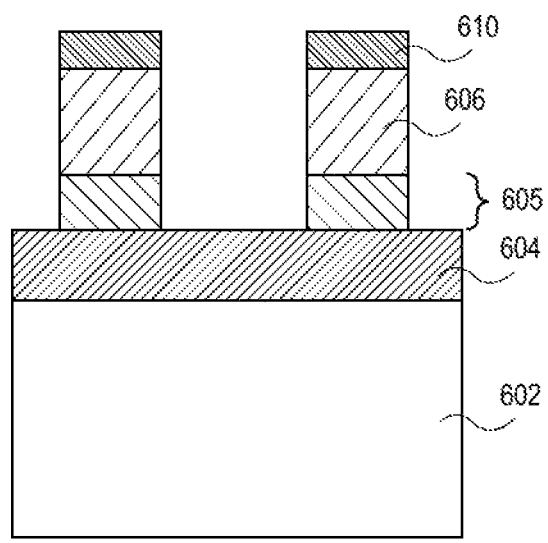
Figure 6C:
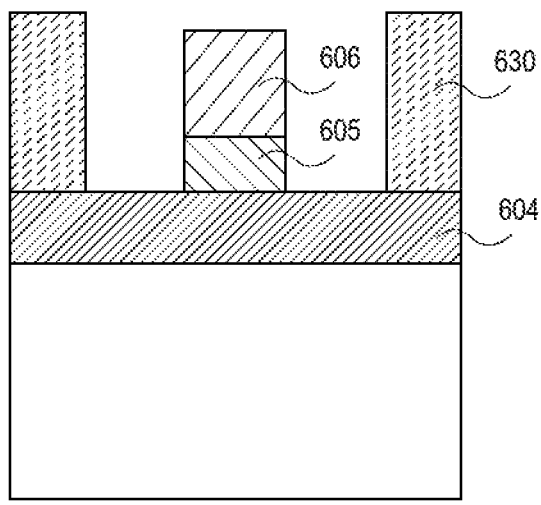
Figure 6D:
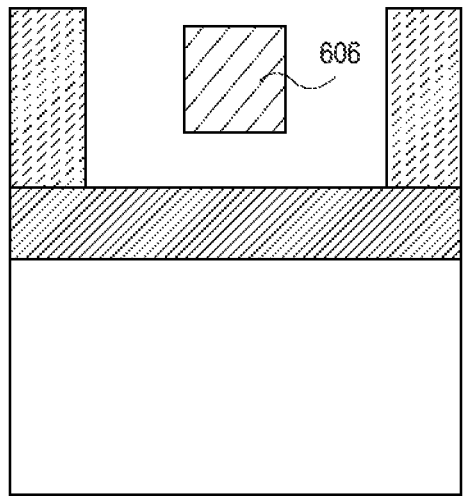
Figure 6E:
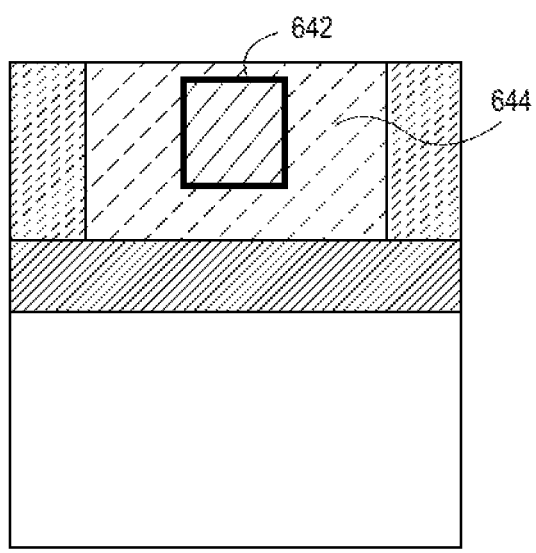
Figure 6F:
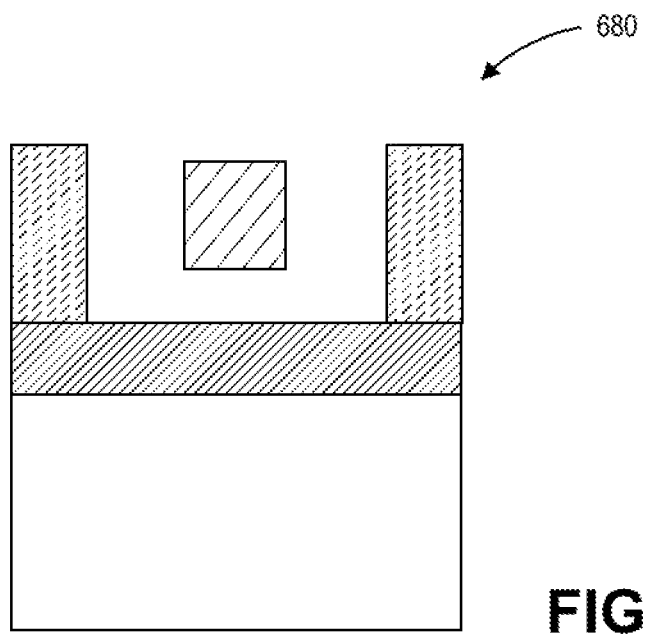
Figure 6G:
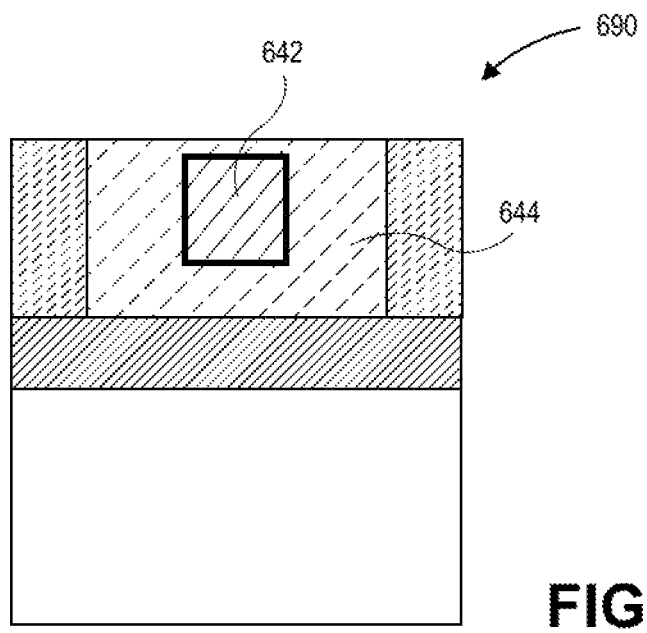

In an example utilizing already-formed buried oxide approach, FIGS. 6A-6G illustrate cross-sectional views of various operations in another method of fabricating a semiconductor device, in accordance with an embodiment of the present invention. Referring to FIG. 6A, a starting semiconductor structure 600 includes semiconductor bodies 606, such as silicon fins, disposed on an undercut etch stop layer 605, such as a silicon germanium etch stop layer. The undercut etch stop layer 605 is disposed on an insulating layer 604, such as a buried $SiO_2$ layer of a silicon-on-insulator (SOI) substrate. The insulating layer 604 is disposed on a substrate 602, such as a silicon substrate. A hardmask layer 610, such as a silicon nitride hardmask layer, is disposed on the semiconductor bodies 606. The undercut etch stop layer 605 is patterned to expose insulating layer 604, as depicted in FIG. 6B, e.g., by a dry etch process. Focusing the remainder of the description on only one semiconductor body 606, the hardmask 610 is removed and a dielectric pattern 630 is formed to surround the semiconductor body 606 and undercut etch stop layer 605, as depicted in FIG. 6C, e.g., an inter-layer dielectric (ILD) pattern. Although not depicted in FIG. 6C, source and drain undercut (e.g., as described in association with FIGS. 2A-2C) and a replacement gate process may also be performed at, prior to or after, this stage. Referring to FIG. 6D, the bottom sacrificial layer (and top if present, such as described in association with FIGS. 5A-5J) is removed. Then, a gate dielectric layer 642 and metal gate electrode 644 may be formed, as depicted in FIG. 6E. Referring to FIGS. 6F and 6G (latter is repeat of FIG. 6E), respectively, a comparison between the FIN cut 680 and poly cut 690 views is provided. In the former view, the possibility to fabricate a trench contact wrap-around is available in the source and drain regions.

It is to be understood that additional wire structures (such as those described in association with FIGS. 3A-3C) may also be fabricated in association with the fin structures described and illustrated in FIGS. 4A-4J, 5A-5-J and 6A-6G above.

One or more embodiments described herein can be implemented improve performance on, e.g., 14 nanometer and smaller node products and reduce standby leakage. Standby leakage reduction may be particularly important for system-on-chip (SOC) products with extremely stringent standby power requirements. Furthermore, other or the same embodiments may take advantage of higher mobility properties of strained channel engineering using SiGe or Ge as S/D stressors as an example. Also, the gate-all-around and/or contact-all-around structures are expected to improve short channel performance and transistor contact resistance.

One or more embodiments of the present invention are directed at improving the channel mobility for NMOS or PMOS transistors, or both. Mobility may be improved using strain, e.g., in the channel region. Thus, one or more approaches described herein provide the appropriate strain in the channel regions for both NMOS and PMOS transistors. In an embodiment, strained NMOS and PMOS gate-all-around devices are provided.

More specifically, one or more embodiments of the present invention include compressive strain for improved hole mobility for PMOS nanowire-based devices and tensile strain for improved electron mobility for NMOS nanowire-based devices. In an embodiment, strained silicon and strained silicon germanium devices are formed from such layers in order to improve or maximize device performance. In an embodiment, NMOS and PMOS uniaxially strained nanowire or nanoribbon devices are fabricated on or above a common substrate by one or more approaches described above. The PMOS transistors may include SiGe having uniaxial compressive strain along the current flow direction, while the NMOS transistors may include silicon having uniaxial tensile strain along the current flow direction.

Figure 7:
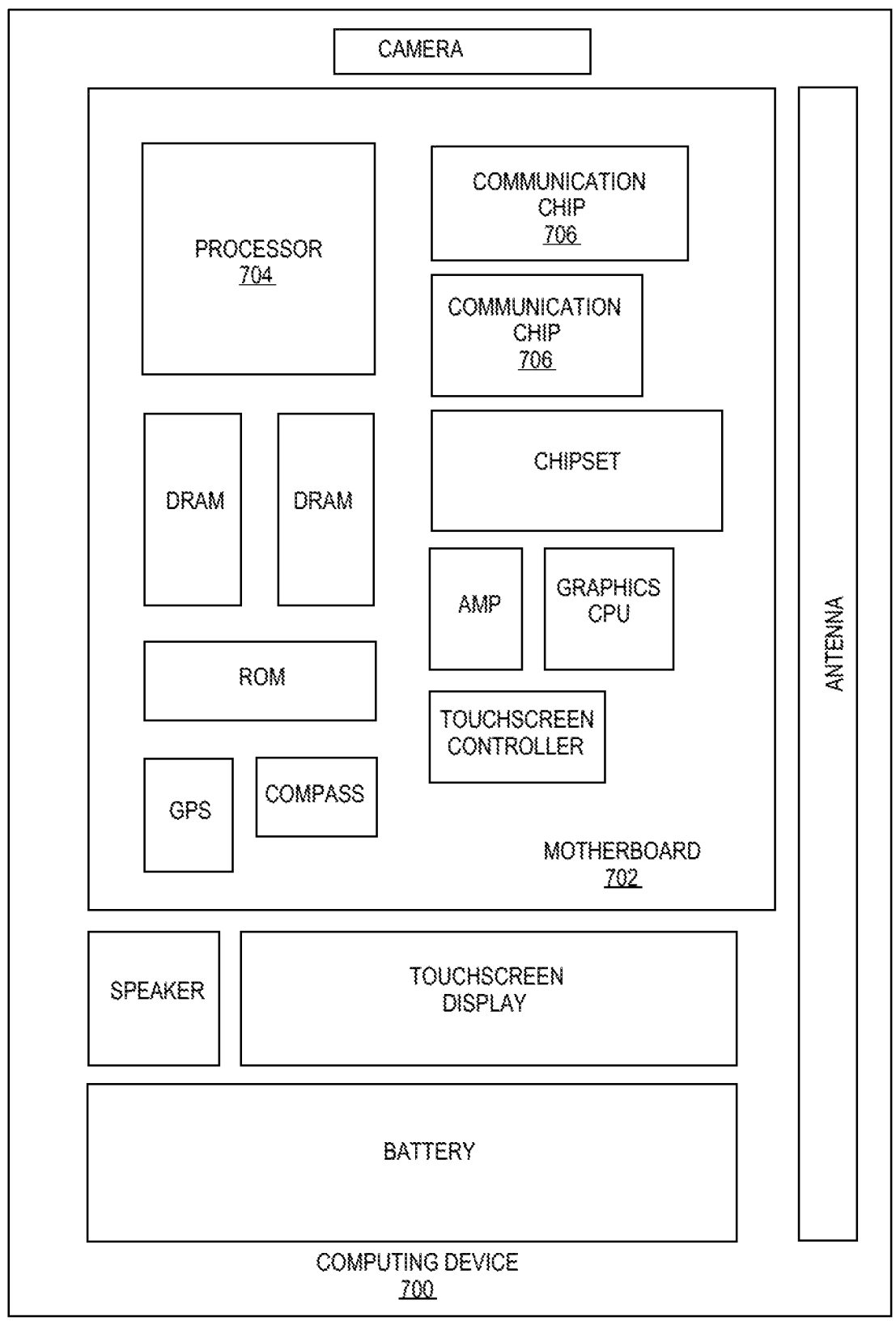
FIG. 7 illustrates a computing device in accordance with one implementation of an embodiment of the invention.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip includes one or more devices, such as MOS-FET transistors built in accordance with implementations of the invention.

In further implementations, another component housed within the computing device 700 may contain an integrated circuit die that includes one or more devices, such as MOS-FET transistors built in accordance with implementations of the invention.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Thus, embodiments of the present invention include strained gate-all-around semiconductor devices formed on globally or locally isolated substrates.

In an embodiment, a semiconductor device includes a semiconductor substrate. An insulating structure is disposed above the semiconductor substrate. A three-dimensional channel region is disposed above the insulating structure. Source and drain regions are disposed on either side of the three-dimensional channel region and on an epitaxial seed layer. The epitaxial seed layer is composed of a semiconductor material different from the three-dimensional channel region and disposed on the insulating structure. A gate electrode stack surrounds the three-dimensional channel region with a portion disposed on the insulating structure and laterally adjacent to the epitaxial seed layer.

In one embodiment, the insulating structure is a global insulating layer.

In one embodiment, the insulating structure includes one or more isolation pedestals.

In one embodiment, the three-dimensional channel region is composed of silicon, and the epitaxial seed layer is composed of silicon germanium.

In one embodiment, the source and drain regions are composed of silicon germanium and provide a uniaxial stress to the three-dimensional channel region.

In one embodiment, the semiconductor structure further includes a pair of insulating spacers. One spacer is disposed between the gate electrode and the source region. The other spacer is disposed between the gate electrode and the drain region. The epitaxial seed layer extends underneath each of the pair of spacers.

In one embodiment, the semiconductor structure further includes a pair of conducting contacts. One contact is disposed on and partially surrounds the source region. The other contact is disposed on and partially surrounds the drain region.

In one embodiment, the semiconductor structure further includes one or more nanowires disposed in a vertical arrangement above the three-dimensional channel region. The gate electrode stack surrounds a channel region of each of the one or more nanowires. In one embodiment, the gate electrode stack is composed of a high-k gate dielectric layer and a metal gate electrode.

In an embodiment, a semiconductor device includes a semiconductor substrate. An insulating structure is disposed above the semiconductor substrate. A three-dimensional channel region is disposed on an epitaxial seed layer disposed on the insulating structure. The epitaxial seed layer is composed of a semiconductor material different from the three-dimensional channel region. A gate electrode stack partially surrounds the three-dimensional channel region. Source and drain regions are disposed on either side of the three-dimensional channel region and above the insulating structure. A pair of conducting contacts is included, one contact disposed on and surrounding the source region, and the other contact disposed on and surrounding the drain region. A portion of each of the pair of contacts is disposed on the insulating structure and laterally adjacent to the epitaxial seed layer.

In one embodiment, the insulating structure includes a global insulating layer.

In one embodiment, the insulating structure includes one or more isolation pedestals.

In one embodiment, the three-dimensional channel region is composed of silicon, and the epitaxial seed layer is composed of silicon germanium.

In one embodiment, the source and drain regions are composed of silicon germanium and provide a uniaxial stress to the three-dimensional channel region.

In one embodiment, the semiconductor structure further includes a pair of insulating spacers. One spacer is disposed between the gate electrode and the source region. The other spacer is disposed between the gate electrode and the drain region. The epitaxial seed layer extends underneath each of the pair of spacers.

In one embodiment, the semiconductor structure further includes one or more nanowires disposed in a vertical arrangement above the three-dimensional channel region. The gate electrode stack surrounds a channel region of each of the one or more nanowires.

In one embodiment, the gate electrode stack includes a high-k gate dielectric layer and a metal gate electrode.

In an embodiment, a semiconductor device includes a semiconductor substrate. An insulating structure is disposed above the semiconductor substrate. A three-dimensional channel region is disposed above the insulating structure. A gate electrode stack surrounds the three-dimensional channel region with a portion disposed on the insulating structure. Source and drain regions are disposed on either side of the three-dimensional channel region and above the insulating structure. A pair of conducting contacts is included, one contact disposed on and surrounding the source region, and the other contact disposed on and surrounding the drain region. A portion of each of the pair of contacts is disposed on the insulating structure. A pair of insulating spacers is included, one spacer disposed between the gate electrode and the source region, and the other spacer disposed between the gate electrode and the drain region. A remnant of an epitaxial seed layer is disposed underneath each of the pair of spacers and laterally adjacent to a portion of the gate electrode stack and a portion of each of the conducting contacts. The remnant of the epitaxial seed layer is composed of a semiconductor material different from the three-dimensional channel region.

In one embodiment, the insulating structure includes a global insulating layer.

In one embodiment, the insulating structure includes one or more isolation pedestals.

In one embodiment, the three-dimensional channel region is composed of silicon, and the remnant of the epitaxial seed layer is composed of silicon germanium.

In one embodiment, the source and drain regions are composed of silicon germanium and provide a uniaxial stress to the three-dimensional channel region.

In one embodiment, the semiconductor structure further includes one or more nanowires disposed in a vertical arrangement above the three-dimensional channel region. The gate electrode stack surrounds a channel region of each of the one or more nanowires.

In one embodiment, the gate electrode stack includes a high-k gate dielectric layer and a metal gate electrode.

In an embodiment, a method of fabricating a semiconductor device includes forming a three-dimensional semiconductor structure on an epitaxial seed layer disposed above a semiconductor substrate. The epitaxial seed layer is composed of a semiconductor material different from the three-dimensional semiconductor structure. The three-dimensional semiconductor structure is etched to provide a three-dimensional channel region and to expose portions of the epitaxial seed layer on either side of the three-dimensional channel region. Source and drain regions are formed on either side of the three-dimensional channel region and on an epitaxial seed layer. The three-dimensional channel region and the source and drain regions are insulated from the semiconductor substrate. Subsequently, a portion of the epitaxial seed layer is removed. A gate electrode stack is formed at least partially surrounding the three-dimensional channel region. A pair of conducting contacts is formed, one contact at least partially surrounding the source region, and the other contact at least partially surrounding the drain region.

In one embodiment, insulating the three-dimensional channel region and the source and drain regions includes providing a global insulating layer on the semiconductor substrate.

In one embodiment, insulating the three-dimensional channel region and the source and drain regions includes forming one or more isolation pedestals.

In one embodiment, forming the gate electrode stack includes using a replacement gate process.

In one embodiment, removing the portion of the epitaxial seed layer includes removing a portion between the three-dimensional channel region and the semiconductor substrate. The gate electrode stack surrounds the three-dimensional channel region.

In one embodiment, removing the portion of the epitaxial seed layer includes removing a portion between the source and drain regions and the semiconductor substrate. The one contact surrounds the source region and the other contact surrounds the drain region.

What is claimed is:

1. A semiconductor device, comprising:
   a semiconductor substrate;
   an isolation pedestal disposed above the semiconductor substrate, the isolation pedestal having a unitary body with a non-planar uppermost surface;
   a three-dimensional channel region disposed above the isolation pedestal;
   one or more nanowires disposed in a vertical arrangement above the three-dimensional channel region;
   source and drain regions disposed on either side of the three-dimensional channel region, wherein the source and drain regions are disposed on an epitaxial seed layer, the epitaxial seed layer comprising a semiconductor material different from the three-dimensional channel region and disposed on the non-planar uppermost surface of the isolation pedestal; and
   a gate electrode stack surrounding the three-dimensional channel region with a portion disposed on the non-planar uppermost surface of the isolation pedestal, wherein the gate electrode stack further surrounds a channel region of each of the one or more nanowires.

2. The semiconductor device of claim 1, further comprising:
   a pair of insulating spacers, one spacer disposed between the gate electrode stack and the source region, and the other spacer disposed between the gate electrode stack and the drain region, wherein the epitaxial seed layer extends underneath each of the pair of spacers.

3. The semiconductor device of claim 1, further comprising:
   a pair of conducting contacts, one contact disposed on and partially surrounding the source region, and the other contact disposed on and partially surrounding the drain region.

4. A semiconductor structure, comprising:
   a semiconductor substrate;
   an isolation pedestal above the semiconductor substrate, the isolation pedestal having a unitary body with a non-planar uppermost surface;
   a semiconductor body above the isolation pedestal;
   one or more nanowires disposed in a vertical arrangement above the semiconductor body;
   a first source or drain region at a first side of the semiconductor body;
   a second source or drain region at a second side of the semiconductor body, the second side opposite the first side;
   a gate electrode stack completely surrounding the semiconductor body, and wherein a portion of the gate electrode stack is on the non-planar uppermost surface of the isolation pedestal, wherein the gate electrode stack further surrounds a channel region of each of the one or more nanowires;
   a first conducting contact on and at least partially surrounding the first source or drain region; and
   a second conducting contact on and at least partially surrounding the second source or drain region, wherein the first conducting contact is completely surrounding the first source or drain region, and the second conducting contact is completely surrounding the second source or drain region.

5. The semiconductor structure of claim 4, wherein a portion of the first conducting contact and a portion of the second conducting contact is on the non-planar uppermost surface of the isolation pedestal.

6. The semiconductor structure of claim 4, further comprising:
   a first insulating spacer between a first side of the gate electrode stack and the first source or drain region; and
   a second insulating spacer between a second side of the gate electrode stack and the second source or drain region, the second side of the gate electrode stack opposite the first side of the gate electrode stack.

7. A semiconductor device, comprising:
   a semiconductor substrate;
   an isolation pedestal disposed above the semiconductor substrate, the isolation pedestal having a unitary body with a non-planar uppermost surface;
   a three-dimensional channel region disposed above the isolation pedestal;
   a nanowire above the three-dimensional channel region;
   source and drain regions disposed on either side of the three-dimensional channel region and on either side of the nanowire, wherein the source and drain regions are disposed on an epitaxial seed layer, the epitaxial seed layer comprising a semiconductor material different from the three-dimensional channel region and disposed on the non-planar uppermost surface of the isolation pedestal; and
   a gate electrode stack surrounding the three-dimensional channel region with a portion disposed on the non-planar uppermost surface of the isolation pedestal, wherein the gate electrode stack further surrounds a channel region of the nanowire.

8. The semiconductor device of claim 7, further comprising:
a pair of insulating spacers, one spacer disposed between the gate electrode stack and the source region, and the other spacer disposed between the gate electrode stack and the drain region, wherein the epitaxial seed layer extends underneath each of the pair of spacers.

9. The semiconductor device of claim 7, further comprising:
a pair of conducting contacts, one contact disposed on and partially surrounding the source region, and the other contact disposed on and partially surrounding the drain region.

10. A semiconductor device, comprising:
a semiconductor substrate;
an isolation pedestal disposed above the semiconductor substrate, the isolation pedestal having a unitary body with a non-planar uppermost surface;
a three-dimensional channel region disposed above the isolation pedestal;
one or more nanowires disposed in a vertical arrangement above the three-dimensional channel region;
source and drain regions disposed on either side of the three-dimensional channel region;
a gate electrode stack surrounding the three-dimensional channel region with a portion disposed on the non-planar uppermost surface of the isolation pedestal, wherein the gate electrode stack further surrounds a channel region of each of the one or more nanowires; and
a pair of conducting contacts, one contact disposed on and surrounding the source region, and the other contact disposed on and surrounding the drain region, wherein a portion of each of the pair of contacts is disposed on the non-planar uppermost surface of the isolation pedestal.

11. A semiconductor device, comprising:
a semiconductor substrate;
an isolation pedestal disposed above the semiconductor substrate, the isolation pedestal having a unitary body with a non-planar uppermost surface;
a three-dimensional channel region disposed above the isolation pedestal;
a nanowire above the three-dimensional channel region;
source and drain regions disposed on either side of the three-dimensional channel region and on either side of the nanowire;
a gate electrode stack surrounding the three-dimensional channel region with a portion disposed on the non-planar uppermost surface of the isolation pedestal, wherein the gate electrode stack further surrounds a channel region of the nanowire; and
a pair of conducting contacts, one contact disposed on and surrounding the source region, and the other contact disposed on and surrounding the drain region, wherein a portion of each of the pair of contacts is disposed on the non-planar uppermost surface of the isolation pedestal.

* * * * *